(12) United States Patent
Sugihara

(10) Patent No.: US 6,974,999 B2
(45) Date of Patent: Dec. 13, 2005

(54) SEMICONDUCTOR DEVICE AND METHOD OF MANUFACTURING THE SAME

(75) Inventor: Tsuyoshi Sugihara, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/265,253

(22) Filed: Oct. 7, 2002

(65) Prior Publication Data

US 2003/0164519 A1 Sep. 4, 2003

(30) Foreign Application Priority Data

Mar. 1, 2002 (JP) .............................. 2002-055545

(51) Int. Cl.[7] .............................................. H01L 29/76
(52) U.S. Cl. ...................... 257/344; 257/345; 257/343; 257/346; 257/368; 257/370; 257/369; 257/366; 257/406; 257/407; 257/408; 438/205; 438/206; 438/207; 438/208
(58) Field of Search ................................ 257/293, 294, 257/296, 295, 297, 344, 343, 345, 346, 368, 257/370, 369, 366, 406, 407, 408; 438/305, 438/206, 682, 296, 205, 207, 208

(56) References Cited

U.S. PATENT DOCUMENTS

| | | | | |
|---|---|---|---|---|
| 5,436,482 A | * | 7/1995 | Ogoh | ........................ 257/344 |
| 5,817,562 A | * | 10/1998 | Chang et al. | ............... 438/305 |
| 5,858,847 A | * | 1/1999 | Zhou et al. | ................. 438/305 |
| 6,171,973 B1 | | 1/2001 | Schiavone et al. | |
| 6,251,778 B1 | * | 6/2001 | Fang et al. | .................. 438/682 |
| 6,403,432 B1 | * | 6/2002 | Yu et al. | ...................... 438/296 |
| 6,521,540 B1 | * | 2/2003 | Li | .............................. 438/706 |
| 6,620,668 B2 | * | 9/2003 | Lee et al. | .................... 438/199 |
| 2001/0052611 A1 | * | 12/2001 | Kim | ........................... 257/296 |

FOREIGN PATENT DOCUMENTS

JP  2000-31485  1/2000

* cited by examiner

Primary Examiner—Nathan J. Flynn
Assistant Examiner—Fazli Erdem
(74) Attorney, Agent, or Firm—Oblon, Spivak, McClelland, Maier & Neustadt, P.C.

(57) ABSTRACT

It is an object to suppress a change in a characteristic of a semiconductor device with a removal of a hard mask while making the most of an advantage of a gate electrode formed by using the hard mask. A gate electrode (3) is formed by etching using a hard mask as a mask and the hard mask remains on an upper surface of the gate electrode (3) at a subsequent step. In the meantime, the upper surface of the gate electrode (3) can be therefore prevented from being unnecessarily etched. The hard mask is removed after ion implantation for forming a source-drain region. Consequently, the influence of the removal of the hard mask on a characteristic of a semiconductor device can be suppressed. In that case, moreover, a surface of a side wall (4) is also etched by a thickness of (d) so that an exposure width of an upper surface of the source-drain region is increased. After the removal of the hard mask, it is easy to salicide the gate electrode (3) and to form a contact on the gate electrode (3).

12 Claims, 16 Drawing Sheets

FIG. 17A
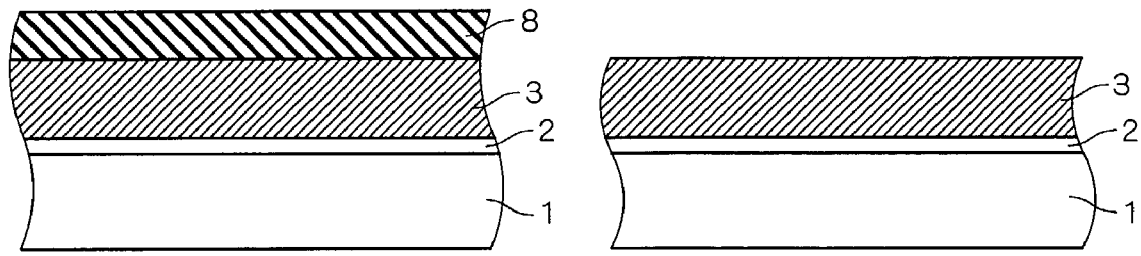
FIG. 17B
FIG. 18A
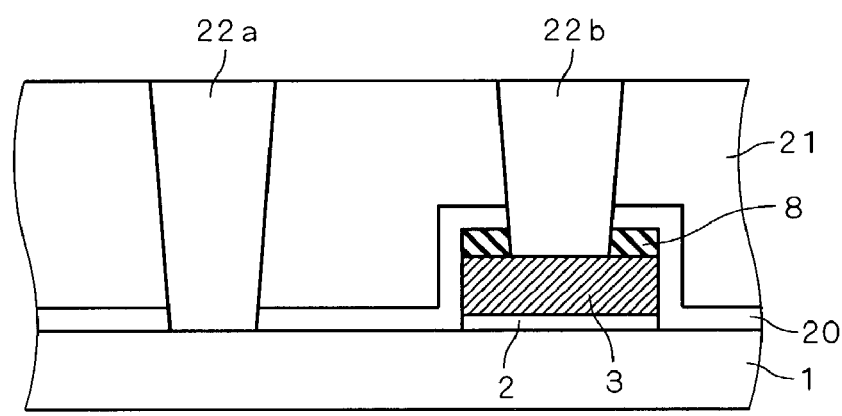
FIG. 18B
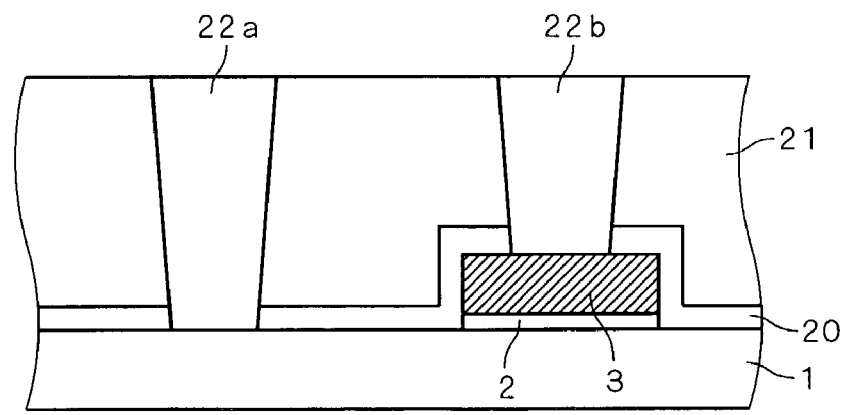

CELL ARRAY REGION   PERIPHERAL TRANSISTOR REGION

CELL ARRAY REGION   PERIPHERAL TRANSISTOR REGION

CELL ARRAY REGION  PERIPHERAL TRANSISTOR REGION

CELL ARRAY REGION  PERIPHERAL TRANSISTOR REGION

SEMICONDUCTOR DEVICE AND METHOD OF MANUFACTURING THE SAME

BACKGROUND OF THE INVENTION

1. Field of the Invention

The present invention relates to a semiconductor device, and more particularly to a semiconductor device having a gate electrode formed by using a hard mask and a method of manufacturing the semiconductor device.

2. Description of the Background Art

In a semiconductor device having a gate electrode, conventionally, precision in a dimension of the gate electrode greatly influences a variation in characteristics of individual semiconductor elements and the influence is further increased with an enhancement in integration of the semiconductor device. For example, substrate reflection is prevented by using an inorganic or organic reflecting preventive film (such as an SiN film, an SiON film or the like which is formed by plasma CVD) during exposure of a resist and a thickness of the resist is reduced in order to enhance a resolution of a gate pattern. In particular, the reduction in the thickness of the resist tends to further progress with an increase in the integration of the semiconductor device in recent years.

In general, there are mainly two different methods of forming a gate electrode. As one of the methods, a resist is formed on a gate electrode material and the gate electrode material is subjected to etching by using the resist itself as a mask. As the other method, a film having a very high etching resistance to the gate electrode material (which will be hereinafter referred to as a "hard mask") is deposited on the gate electrode material, and a resist is first formed on the hard mask, the hard mask is subjected to etching by using the resist as a mask and the resist is removed, and subsequently, the gate electrode material is subjected to the etching by using the patterned hard mask as a mask.

FIGS. 24A and 24B are views for explaining a process for forming a gate electrode by the method of etching a gate electrode material using a resist as a mask. In FIGS. 24A and 24B, the reference numeral 101 denotes a semiconductor substrate, the reference numeral 102 denotes a gate insulating film, the reference numeral 103 denotes a gate electrode material and the reference numeral 104 denotes a resist. As shown in FIG. 24A, first of all, the gate insulating film 102 and the gate electrode material 103 are deposited on the semiconductor substrate 101 and the resist 104 is formed on the gate electrode material 103. As shown in FIG. 24B, the gate electrode material 103 and the gate insulating film 102 are subjected to etching by using the resist 104 as a mask so that a gate electrode 110 is formed. At this time, an etching selectivity for the gate electrode material 103 of the resist 104 is not very great. Therefore, it is apparent that the resist 104 is also etched greatly when the gate electrode material 103 is etched, resulting in a great reduction in the film. For this reason, it is necessary to previously form the resist 104 sufficiently thickly.

On the other hand, FIGS. 25A to 25C are views for explaining a process for forming a gate electrode by the method of etching a gate electrode material using a hard mask as a mask. In FIGS. 25A to 25C, the same components as those in FIGS. 24A and 24B have the same reference numerals. Moreover, the reference numeral 105 denotes a hard mask. As shown in FIG. 25A, first of all, a gate insulating film 102, a gate electrode material 103 and the hard mask 105 are deposited on a semiconductor substrate 101 and a resist 104 is formed on the hard mask 105. Examples of a film to be used for the hard mask 105 include an SiO film, an SiN film and the like which are formed by CVD, for example. As shown in FIG. 25B, next, the hard mask material 105 is subjected to the etching by using the resist 104 as a mask and the resist 104 is then removed. As shown in FIG. 25C, the gate electrode material 103 and the gate insulating film 102 are subjected to the etching by using the hard mask 105 as a mask so that a gate electrode 110 is formed. At this time, since the hard mask 105 has a very high etching selectivity for the gate electrode material 103, a reduction in a film of the hard mask 105 is lessened during the etching. For this reason, it is not necessary to greatly increase the thickness of the hard mask 105 during formation. In other words, when the gate electrode material 103 is to be etched, a thickness of a mask (that is, the hard mask 105) can be reduced so that precision in a dimension of the gate electrode 110 to be formed can be enhanced.

Moreover, the hard mask 105 has such an advantage that the gate electrode 110 can be prevented from being unnecessarily etched by the presence of the hard mask 105 on an upper surface of the gate electrode 110 in the case in which the gate electrode 110 is to be used as a mask in a self-alignment process.

In general, the resist 104 can easily be removed, while the hard mask 105 is removed with difficulty and is to be removed by etching. In the case in which the hard mask 105 is to be removed, therefore, a process for manufacturing a semiconductor device becomes complicated. Moreover, portions other than the hard mask 105 (the gate electrode 110, a wafer surface, an insulating film and the like) are influenced by the etching. Consequently, there is a possibility that a characteristic of the semiconductor device might be changed.

For example, in the case in which the hard mask 105 remains on the upper surface of the gate electrode 110 when the gate electrode 110 is to be salicided (SAlicide: Self Aligned Silicide) or a contact is to be formed on the gate electrode 110, it is necessary to remove the hard mask 105. The gate electrode 110 is salicided by depositing a saliciding reactive material 111 on the gate electrode 110 to carry out a heat treatment. In this case, if the hard mask 105 is not present on the gate electrode 110 as shown in FIG. 26A, a salicide region 112 is formed on the upper surface of the gate electrode 110 which is provided in contact with the saliciding reactive material 111. However, if the hard mask 105 is present on the gate electrode 110 as shown in FIG. 26B, the upper surface of the gate electrode 110 cannot directly come in contact with the saliciding reactive material. Therefore, the salicide region cannot be formed in that state.

Moreover, it is supposed that an interlayer insulating film 113 is formed on the gate electrode 110 and a contact reaching the gate electrode 110 is formed on the interlayer insulating film 113 as shown in FIGS. 27A and 27B. In this case, if a hard mask is not present on the gate electrode 110, it is preferable that only the interlayer insulating film 113 provided on the gate electrode 110 should be etched to form a contact hole as shown in FIG. 27A. However, if the hard mask 105 is present on the gate electrode 110, it is necessary to etch the interlayer insulating film 113 provided on the gate electrode 110, and furthermore, the hard mask 105 as shown in FIG. 27B. Consequently, a step of forming the contact hole becomes complicated.

SUMMARY OF THE INVENTION

In order to solve the problems described above, it is an object of the present invention to provide a semiconductor device capable of making the most of advantages of a hard mask and preventing a characteristic from being changed with a removal of the hard mask, and a method of manufacturing the semiconductor device.

A first aspect of the present invention is directed to a method of manufacturing a semiconductor device comprising the following steps (a) to (d). The step (a) etches a gate electrode material formed on a semiconductor substrate by using a hard mask as a mask, thereby forming at least one gate electrode having the hard mask on an upper surface. The step (b) forms a side wall on a side surface of the gate electrode having the hard mask on the upper surface. The step (c) carries out first ion implantation by using, as a mask, the gate electrode having the hard mask on the upper surface and the side wall. The step (d) removes the hard mask of the predetermined gate electrode by etching after the step (d).

The step (d) is carried out after the step (c). Therefore, a depth and a position of the ion implantation in the step (c) are not influenced by the etching for removing the hard mask in the step (d). Consequently, it is possible to suppress a variation in characteristics of individual semiconductor devices. Moreover, since the gate electrode is formed by using the hard mask as a mask, precision in a dimension of the gate electrode can also be enhanced. At the steps before the step (d), furthermore, the hard mask remains on the upper surface of the gate electrode. Therefore, it is possible to maintain an advantage of the hard mask, for example, protection of the upper surface of the gate electrode. On the other hand, the hard mask provided on the predetermined gate electrode is removed after the step (d). Therefore, it is easy to salicide the gate electrode and to form the contact on the gate electrode at the subsequent steps.

A second aspect of the present invention is directed to a method of manufacturing a semiconductor device comprising the following steps (a) to (i). The step (a) etches a gate electrode material formed on a semiconductor substrate by using a hard mask as a mask, thereby forming at least one gate electrode having the hard mask on an upper surface. The step (b) forms a first resist opening a first channel region of the semiconductor substrate. The step (c) carries out first ion implantation by using, as masks, the gate electrode having the hard mask on the upper surface and the first resist. The step (d) removes the hard mask by etching using the first resist as a mask after the step (c). The step (e) removes the first resist. The step (f) forms a second resist opening a second channel region of the semiconductor substrate. The step (g) carries out second ion implantation by using, as masks, the gate electrode having the hard mask on the upper surface and the second resist. The step (h) removes the hard mask by etching using the second resist as a mask after the step (g). The step (i) removes the second resist.

The steps (d) and (h) are carried out after the steps (c) and (g), respectively. Therefore, the depth and the position of the ion implantation in the steps (c) and (g) are not influenced by the etching for the removal of the hard mask in the steps (d) and (h), respectively. Consequently, a variation in the characteristics of individual semiconductor devices can be suppressed. Moreover, the number of mask alignments is equal to that of the conventional steps of manufacturing a semiconductor device. Thus, precision in a dimension can be prevented from being deteriorated and integration of the semiconductor device can also be enhanced.

A third aspect of the present invention is directed to a method of manufacturing a semiconductor device comprising the following steps (a) to (h). The step (a) etches a gate electrode material formed on a semiconductor substrate by using a hard mask as a mask, thereby forming at least one gate electrode having the hard mask on an upper surface. The step (b) forms a first resist opening a first channel region of the semiconductor substrate. The step (c) carries out first ion implantation by etching using, as masks, the gate electrode having the hard mask on the upper surface and the first resist. The step (d) removes the first resist. The step (e) forms a second resist opening a second channel region of the semiconductor substrate. The step (f) carries out second ion implantation by using, as masks, the gate electrode having the hard mask on the upper surface and the second resist. The step (g) removes the second resist. The step (h) removes the hard mask by etching after the steps (a) to (g).

The step (h) is carried out after the steps (a) to (f). Therefore, the depth and the position of the ion implantation in the steps (c) and (f) are not influenced by the etching for the removal of the hard mask in the step (h), respectively. Consequently, a variation in the characteristics of individual semiconductor devices can be suppressed. Moreover, the number of mask alignments is equal to that of the conventional steps of manufacturing a semiconductor device. Thus, precision in a dimension can be prevented from being deteriorated and integration of the semiconductor device can also be enhanced. At the step (h), furthermore, the first and second resists have already been removed. Therefore, both of the hard mask provided on the gate electrode in the first channel region and the hard mask provided on the gate electrode in the second channel region can be removed at a single etching step. In other words, the process for manufacturing the semiconductor device can be simplified.

A fourth aspect of the present invention is directed to a method of manufacturing a semiconductor device comprising a peripheral circuit having a transistor and a cell array having a memory cell, comprising the following steps (a) to (d). The step (a) etches a gate electrode material formed on a semiconductor substrate by using a hard mask as a mask, thereby forming a first gate electrode of the transistor and a second gate electrode of the memory cell which have the hard mask on upper surfaces. The step (b) forms a resist opening a predetermined channel region in the peripheral circuit and a contact formation region in the cell array. The step (c) carries out ion implantation by using, as masks, the first gate electrode and the second gate electrode which have the hard mask on the upper surfaces, and the resist. The step (d) removes the hard mask by etching using the resist as a mask after the step (c).

The step (d) is carried out after the step (c). Therefore, the depth and the position of the ion implantation in the step (c) are not influenced by the etching for the removal of the hard mask in the step (d). Consequently, a variation in the characteristics of the individual semiconductor devices can be suppressed. Moreover, the first and second gate electrodes are formed by using the hard mask as a mask. Therefore, precision in dimensions of the gate electrodes can also be enhanced. At the step (d), furthermore, it is easy to form the contact on the first and second gate electrodes at the subsequent steps. In the etching of the step (d), moreover, the resist opening the contact formation region is used as the mask. Therefore, the region other than the contact formation region is not unnecessarily subjected to the etching. For example, it is possible to prevent the unnecessary etching for the isolating film formed in the cell array region, thereby maintaining a thickness of the isolating film. Consequently, it is possible to produce such an effect that a contact punch through margin can be prevented from being deteriorated in the process for manufacturing a semiconductor device.

A fifth aspect of the present invention is directed to a semiconductor device comprising a first gate electrode formed on a semiconductor substrate, a side wall formed on a side surface of the first gate electrode, and a source-drain region formed in the semiconductor substrate and having a low impurity concentration region provided so as to sandwich the gate electrode and a high impurity concentration region provided outside the low impurity concentration region so as to sandwich the gate electrode. A width of the side wall is smaller than a space between the first gate electrode and the high impurity concentration region, and a contact is formed on an upper surface of the source-drain region.

The width of the side wall is smaller than the space between the first gate electrode and the source-drain region as seen on a plane. Therefore, an exposure width of the upper surface of the source-drain region is great and a margin of a shift in the formation of the contact in the source-drain region can be increased. Such a structure is obtained by forming the first gate electrode through the etching using the hard mask as a mask and removing the hard mask after forming the source-drain region. In other words, the hard mask is removed after the source-drain region is formed. Therefore, the ion implantation for forming the source-drain region is not influenced by the etching with the removal of the hard mask. Accordingly, a variation in a depth with which the source-drain region is formed is suppressed and a variation in the characteristics of the individual semiconductor devices is prevented. Moreover, since the hard mask provided on the upper surface of the first gate electrode is removed, it is easy to salicide the first gate electrode and to form the contact on the first gate electrode.

A sixth aspect of the present invention is directed to a semiconductor device comprising, on a semiconductor substrate, a peripheral circuit having a transistor and a cell array having a plurality of memory cells. The transistor of the peripheral circuit includes a first gate electrode, a side wall formed on a side surface of the first gate electrode, and a source-drain region formed in the semiconductor substrate and having a low impurity concentration region provided so as to sandwich the gate electrode and a high impurity concentration region provided outside the low impurity concentration region so as to sandwich the gate electrode. A width of the side wall is smaller than a space between the first gate electrode and the high impurity concentration region and a contact is formed on an upper surface of the source-drain region. Moreover, the memory cell of the cell array includes a second gate electrode, and a hard mask formed on an upper surface of the second gate electrode. The hard mask is formed in only a region of the upper surface of the second gate electrode other than a region in which a contact is to be formed.

In the transistor of the peripheral circuit, the width of the side wall is smaller than the space between the first gate electrode and the source-drain region as seen on a plane. Therefore, an exposure width of the upper surface of the source-drain region is great and a margin of a shift in the formation of the contact in the source-drain region can be increased. Such a structure is obtained by forming the first gate electrode through the etching using the hard mask as a mask and removing the hard mask after forming the source-drain region. In other words, the hard mask is removed after the source-drain region is formed. Therefore, the ion implantation for forming the source-drain region is not influenced by the etching with the removal of the hard mask. Accordingly, a variation in a depth with which the source-drain region is formed is suppressed and a variation in the characteristics of the individual semiconductor devices is prevented. Moreover, since the hard mask is not present on the upper surface of the first gate electrode, it is easy to form the contact on the first gate electrode. In the memory cell of the cell array, furthermore, the hard mask is formed in only the region of the upper surface of the second gate electrode other than the region in which the contact is to be formed. Therefore, it is possible to easily form the contact on the second gate electrode.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 17A and 17B are views for explaining a structure of a semiconductor device according to a fourth embodiment;

FIGS. 18A and 18B are views for explaining effects in the fourth embodiment;

FIGS. 19A and 19B to FIG. 22 are views for explaining a process for manufacturing a semiconductor device according to a fifth embodiment;

DESCRIPTION OF THE PREFERRED EMBODIMENTS

<First Embodiment>

Figure 1:
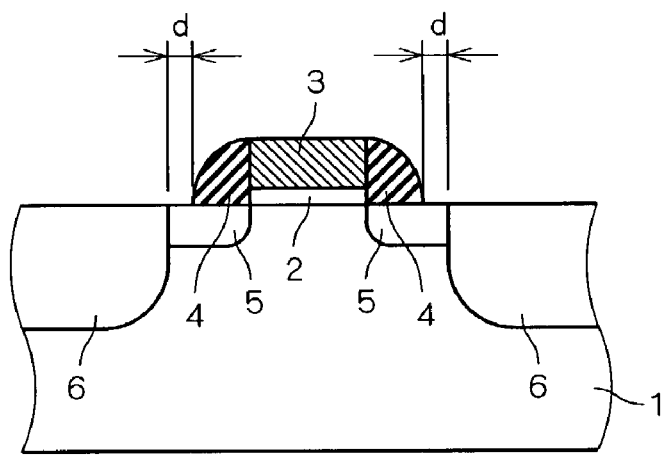
FIG. 1 is a view showing a structure of a semiconductor device according to a first embodiment.

FIG. 1 is a view showing a structure of a semiconductor device according to a first embodiment of the present invention. In FIG. 1, the reference numeral 1 denotes a semiconductor substrate, the reference numeral 2 denotes a gate oxide film, the reference numeral 3 denotes a gate electrode formed by using a hard mask, and the reference numeral 4 denotes a side wall. Moreover, the reference numeral 5 denotes a source-drain region having a low concentration and the reference numeral 6 denotes a source-drain region having a high concentration. The source-drain region 5 having a low concentration is formed by ion implantation using the gate electrode 3 as a mask at a step of forming the semiconductor device. Moreover, the source-drain region 6 having a high concentration is formed by ion implantation using the gate electrode 3 and the side wall 4 as masks in a manufacturing process. As shown in FIG. 1, a space d is provided between the source-drain region 6 having a high concentration and the side wall 4. In other words, the side wall 4 is formed inside an outline of the source-drain region 6 having a high concentration and a width of the side wall 4 is smaller than a distance between the gate electrode 3 and the source-drain region 6 having a high concentration as seen on a plane. Moreover, an upper surface of the gate electrode 3 is not provided with a hard mask used for the formation of the gate electrode 3.

Figure 2:
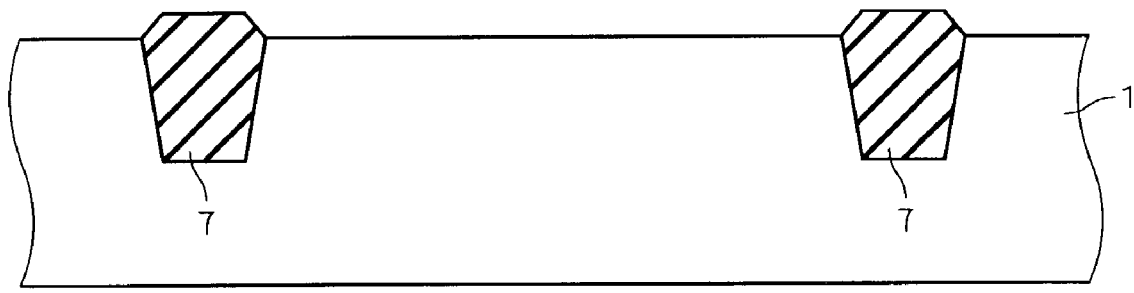
FIGS. 2 to 12 are views for explaining a process for manufacturing the semiconductor device according to the first embodiment.
Figure 3:
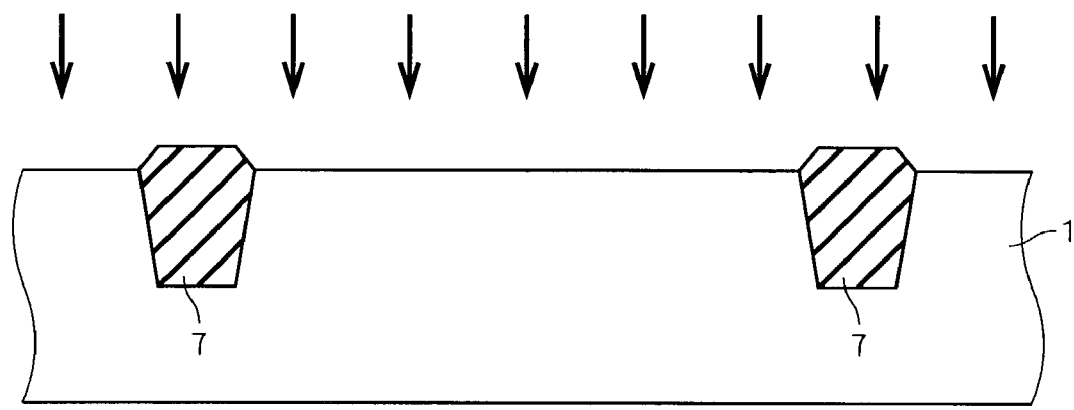
Figure 4:
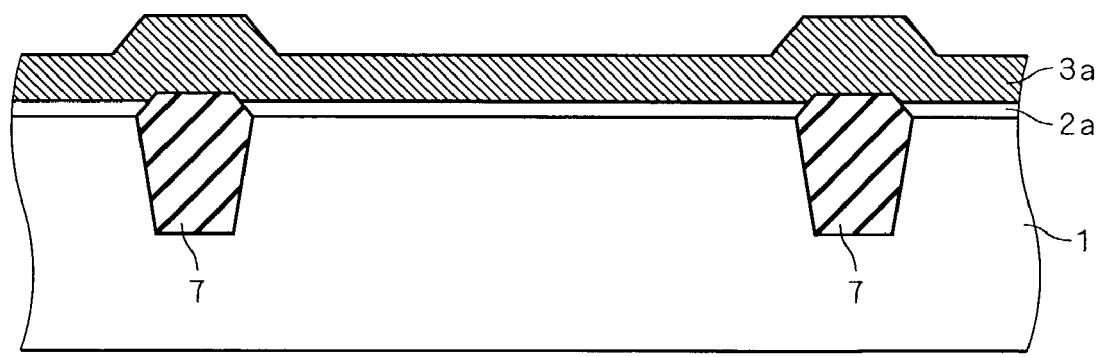

FIGS. 2 to 12 are views for explaining a process for manufacturing the semiconductor device according to the present embodiment shown in FIG. 1. With reference to these drawings, a method of manufacturing the semiconductor device according to the present embodiment will be described. As shown in FIG. 2, first of all, an isolating film 7 is formed on the semiconductor substrate 1. For a method of forming the isolating film 7, generally, LOCOS (LOCal Oxidation of Silicon) or STI (Shallow Trench Isolation) is used. Next, well implantation is carried out to form a P channel (Pch) region and an N channel (Nch) region respectively as shown in FIG. 3. Then, a channel doping step for determining a threshold of a transistor is carried out. As shown in FIG. 4, then, a silicon oxide film 2a to be the gate oxide film 2 is formed on a surface of the semiconductor substrate 1 by thermal oxidation or RTO (Rapid Thermal Oxidation) and a gate electrode material 3a to be the gate electrode 3 is deposited thereon. The gate electrode material 3a may have a single layer structure comprising an Si based film (such as polysilicon or amorphous silicon), for example, or a two-layer structure comprising the Si based film and a salicide film.

Figure 5:
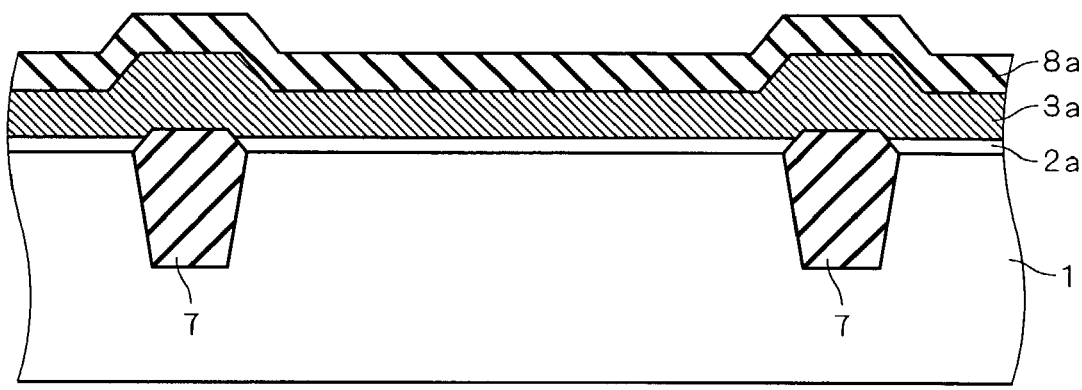
Figure 6:
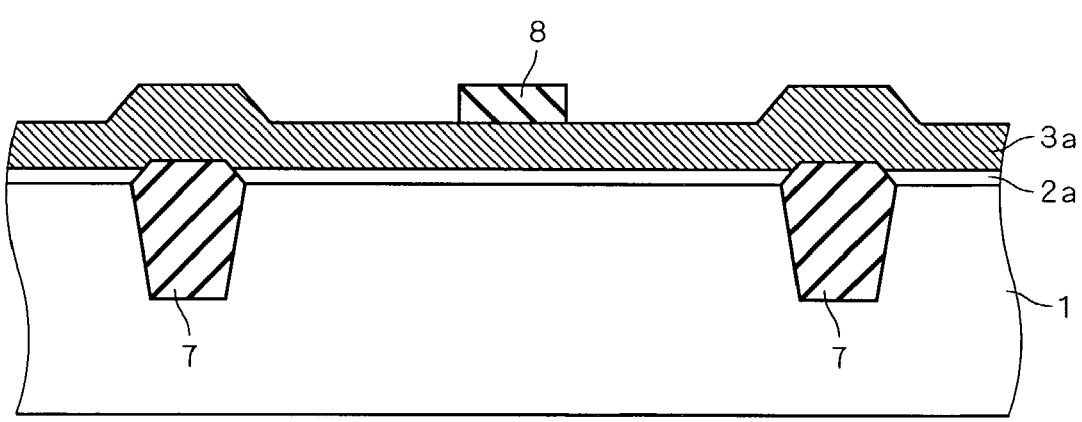
Figure 7:
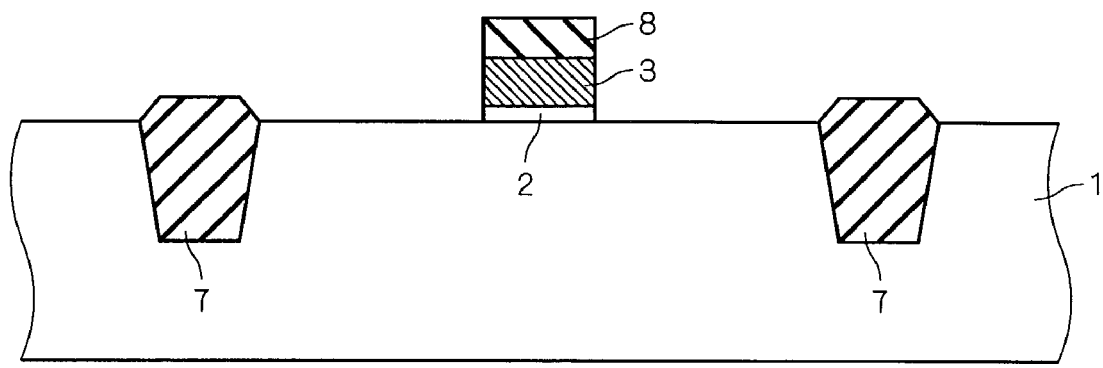

As shown in FIG. 5, furthermore, a hard mask material 8a is formed on the gate electrode material 3a. In general, an SiO film, an SiN film or the like which is formed by CVD is used for the hard mask material 8a. Moreover, their multilayer structure may be used. The hard mask material 8a is patterned (FIG. 6) and the gate electrode material 3a and the silicon oxide film 2a are subjected to etching by using the patterned hard mask 8 as a mask so that the gate electrode 3 having the gate oxide film 2 is formed (FIG. 7). At this time, the hard mask 8 has a very high etching selectivity together with the gate electrode material 3a. Therefore, the hard mask 8 remains on the upper surface of the gate electrode 3 as shown in FIG. 7.

Figure 8:
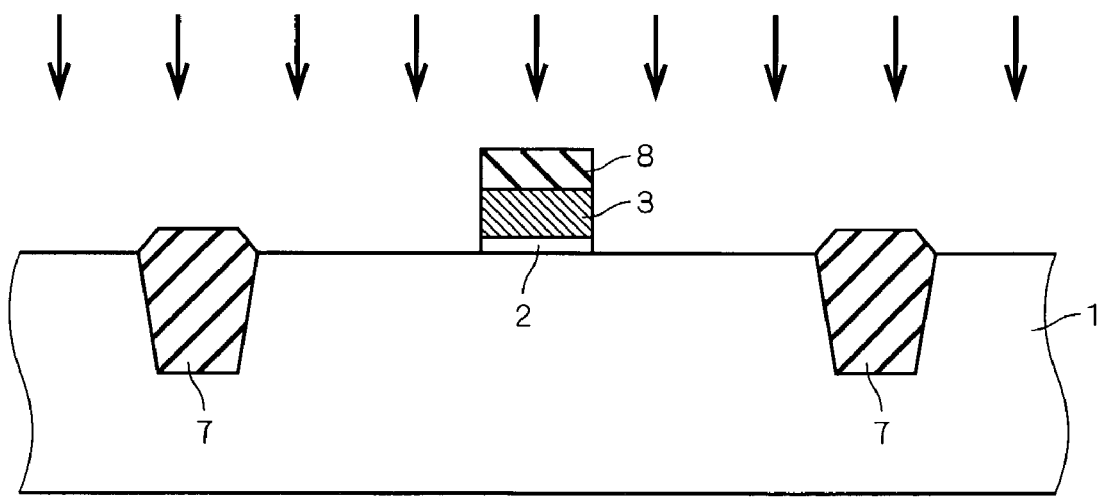
Figure 9:
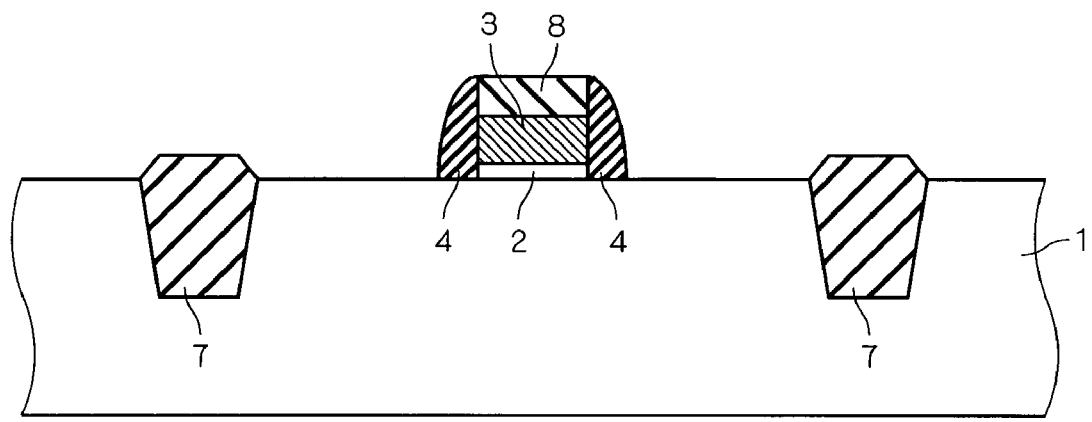
Figure 10:
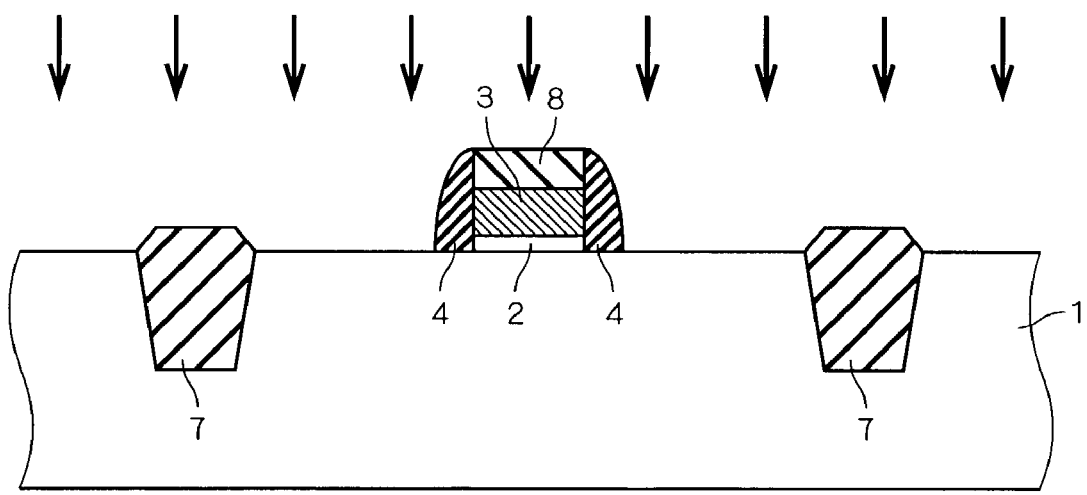

In order to separately carry out ion implantation into the Pch region and the Nch region, then, a resist is formed on the semiconductor substrate 1 and a portion of a first channel region (the Pch region or the Nch region) to be an ion implantation object is opened by photolithography, which is not shown. As shown in FIG. 8, thereafter, ion implantation is carried out by using the resist and the gate electrode 3 having the hard mask 8 on the upper surface as masks. Thus, the source-drain region 5 having a low concentration to be an electric field relaxation layer is formed. As shown in FIG. 9, subsequently, the side wall 4 is formed on a side surface of the gate electrode 3. The side wall can be formed by etching back a whole surface of the SiO film or the SiN film deposited by the CVD, for example. By using the resist, the side wall 4 and the gate electrode 3 as masks, then, ion implantation is carried out in a larger dose amount than that of the ion implantation for the formation of the source-drain region 5 having a low concentration (FIG. 10). Thus, the source-drain region 6 having a high concentration to be an electrode layer is formed.

Figure 11:
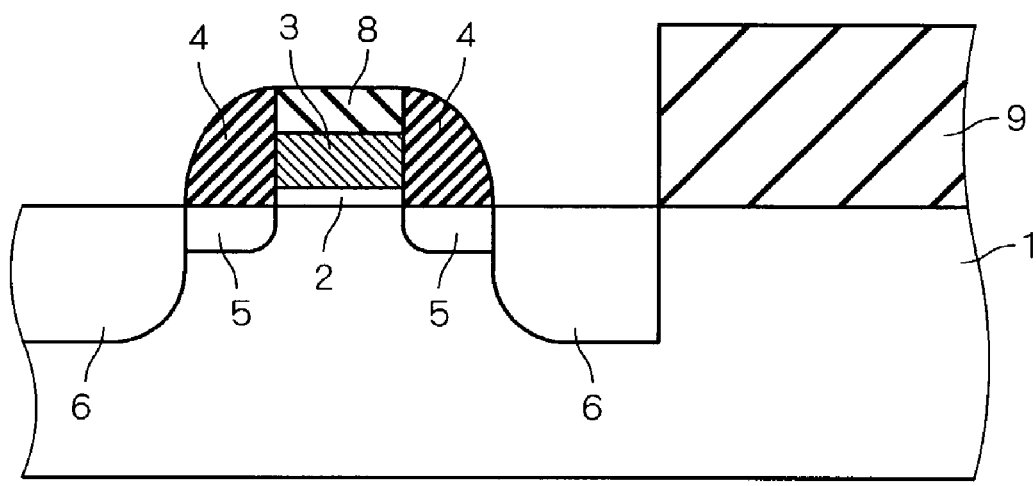

By the steps described above, a structure shown in FIG. 11 is formed. In this state, the hard mask 8 remains on the upper surface of the gate electrode 3. In FIG. 11, the reference numeral 9 denotes a resist formed for carrying out ion implantation in the first channel region at the step described above.

Figure 12:
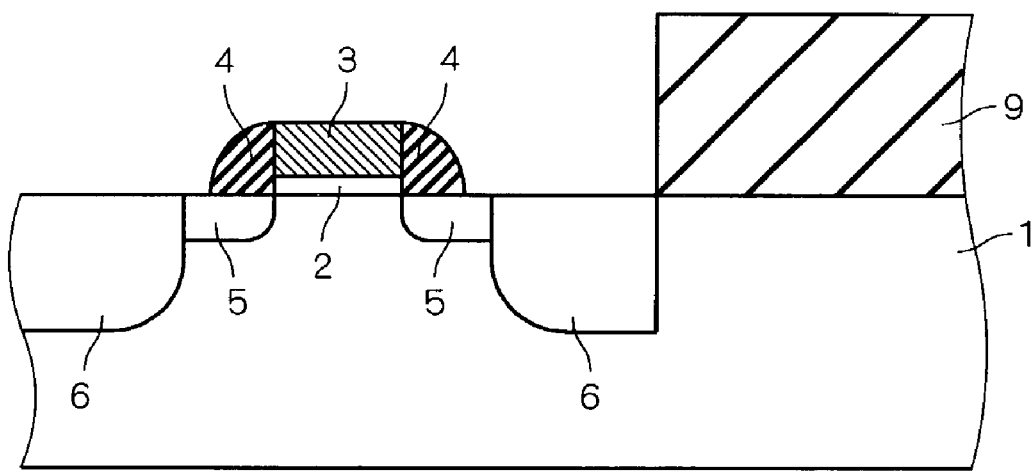

As shown in FIG. 12, the hard mask 8 is removed by etching using the resist 9 as a mask. In that case, a surface of the side wall 4 is also etched slightly. Therefore, the side wall 4 is positioned inside an outline of the source-drain region 6 having a high concentration which is formed by the ion implantation using the side wall 4 as a mask before the removal of the hard mask 8. More specifically, the semiconductor device according to the present embodiment shown in FIG. 1 is formed. Then, the resist 9 is removed.

Next, a resist opening a second channel region which is reverse to the first channel region is formed. For the second channel region, similarly, the semiconductor device according to the present embodiment shown in FIG. 1 is formed in the same procedure as the steps described above, and description will be omitted.

As described above, according to the present embodiment, the gate electrode 3 is formed by using the hard mask 8, and the hard mask 8 remains on the upper surface of the gate electrode 3 in the process for manufacturing the semiconductor device. For this reason, the advantages of the hard mask described above are maintained. More specifically, a thickness of the mask can be reduced during the formation of the gate electrode. Therefore, precision in a dimension of the gate electrode 3 can be enhanced and the upper surface of the gate electrode 3 can be prevented from being unnecessarily etched during the manufacturing process.

On the other hand, the hard mask 8 is finally removed. Therefore, the drawbacks of the hard mask 8 described above can be eliminated. In other words, the gate electrode 3 can easily be salicided at subsequent steps. Moreover, a contact can easily be formed on the gate electrode 3.

When the hard mask 8 is removed before the ion implantation for forming the source-drain regions 5 and 6, a thickness of the surface of the semiconductor substrate into which the ion implantation is to be carried out is varied so that a variation in a depth of the ion implantation (that is, depths of the source-drain regions 5 and 6) is generated. Moreover, a variation in an etching amount of the side wall 4 is generated with the removal of the hard mask 8. Therefore, a variation is also generated in a position of the source-drain region 6 having a high concentration formed by the ion implantation using the side wall 4 as a mask. Due to the variation, a variation is also generated in characteristics of individual transistors. As a result, reliability of the semiconductor device is deteriorated.

On the other hand, in the present embodiment, the hard mask 8 is removed after the ion implantation for the formation of the source-drain regions 5 and 6 of the transistor. Therefore, it is possible to prevent the characteristics of the semiconductor device from being adversely influenced by the step of removing the hard mask 8.

Moreover, the number of mask alignments is equal to that in a process for manufacturing a conventional semiconductor device. Therefore, precision in a dimension can be prevented from being deteriorated and integration of the semiconductor device can also be achieved.

Furthermore, the surface of the side wall 4 is scraped with the removal of the hard mask 8. Consequently, a width of the side wall 4 itself is reduced. In other words, an exposure width of the upper surface of the source-drain region is increased. Consequently, it is also possible to obtain an advantage that a margin of a shift of the contact from the source-drain region can be increased.

The scope of the present invention is not restricted to the structure of the semiconductor device shown in FIG. 1. For example, the source-drain regions of the transistor do not need to take a transversely symmetrical shape with the gate electrode interposed therebetween but may have an optional shape. Moreover, the source-drain region is not restricted to the two-layer structure comprising the source-drain region 5 having a low concentration and the source-drain region 6 having a high concentration but may have a multilayer structure comprising three layers or more and a single layer structure, for example. While the side wall 4 is directly formed on an upper surface of the semiconductor substrate 1 in FIG. 1, another insulating film may be formed on a lower surface of the side wall.

<Second Embodiment>

In the first embodiment, the hard mask 8 formed on the upper surface of the gate electrode 3 is to be removed twice in the first channel region and the second channel region (that is, the Pch region and the Nch region) separately because the resist 9 is formed as shown in FIGS. 11 and 12.

In the present embodiment, a hard mask is removed by completing both of the ion implantation into the first channel region and the ion implantation into the second channel region, removing a resist to be a mask in that case and then etching back a whole surface of a wafer.

Figure 13:
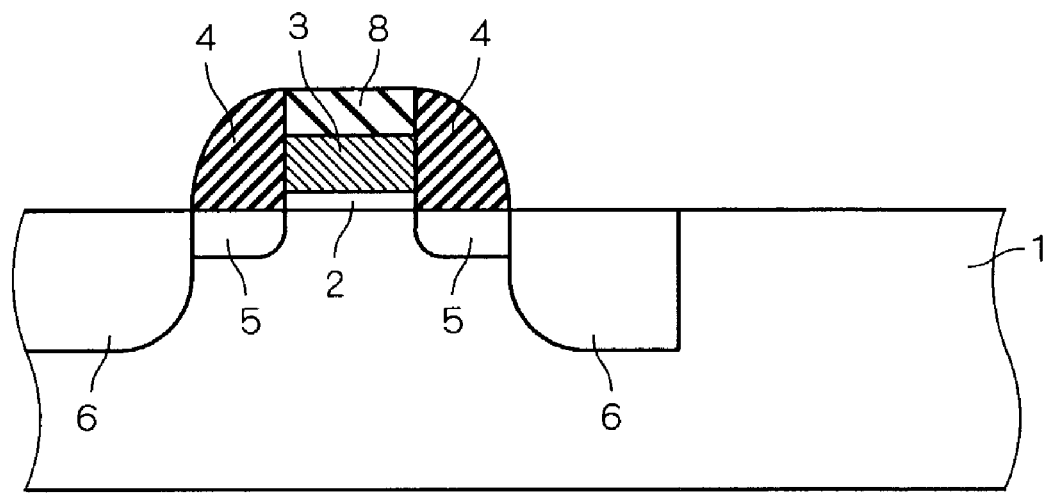
FIGS. 13 and 14 are views for explaining a process for manufacturing a semiconductor device according to a second embodiment.
Figure 14:
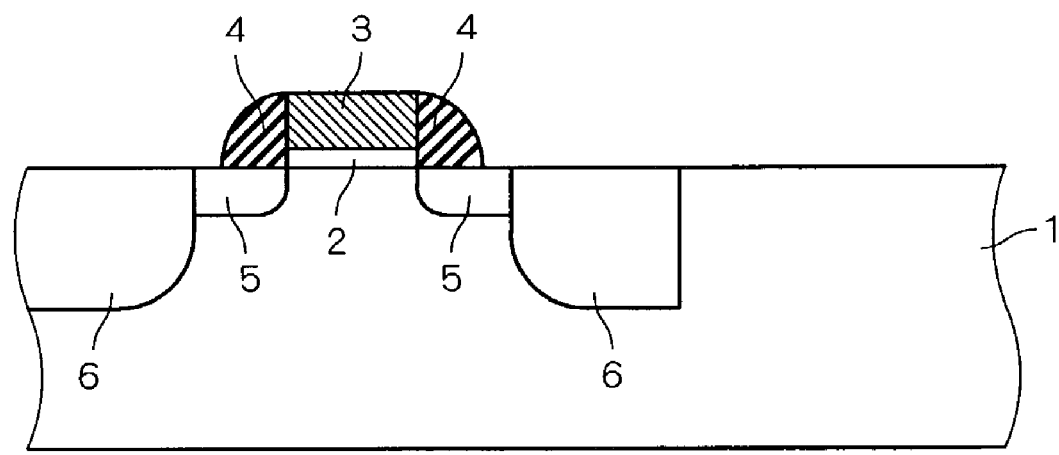

More specifically, in the present embodiment, when the ion implantation into the first channel region and the ion implantation into the second channel region are completed and the resist to be the mask in that case is removed, a hard mask 8 remains on an upper surface of a gate electrode 3 as shown in FIG. 13. Then, the hard mask 8 is removed as shown in FIG. 14 by etching back the whole surface of the wafer. Thus, the semiconductor device shown in FIG. 1 is formed.

In the first embodiment, accordingly, it is necessary to carry out the step of removing the hard mask twice in the Pch region and the Nch region separately, it is sufficient that etch back is once carried out in the present embodiment. Consequently, the manufacturing step can be simplified.

Since other manufacturing steps are the same as those in the first embodiment, detailed description will be omitted. Also in the present embodiment, it is apparent that the same effects as those described in the first embodiment can be obtained.

<Third Embodiment>

In the second embodiment, it is premised that the hard mask 8 provided on the gate electrode 3 in the first channel region and the second channel region (that is, the Pch region and the Nch region) is entirely removed. In many cases, however, it is not necessary to entirely remove the hard mask 8 in an actual semiconductor device. In those cases, it is significant that the hard mask 8 is to remain in a portion in which the hard mask 8 does not need to be removed in order to make the most of the advantages of the hard mask 8 at the subsequent steps.

In the present embodiment, a hard mask is removed by completing ion implantation into a first channel region and ion implantation into a second channel region, removing a resist to be a mask in that case, and then forming a resist opening only a portion from which the hard mask 8 is to be removed and carrying out etch back.

Figure 15:
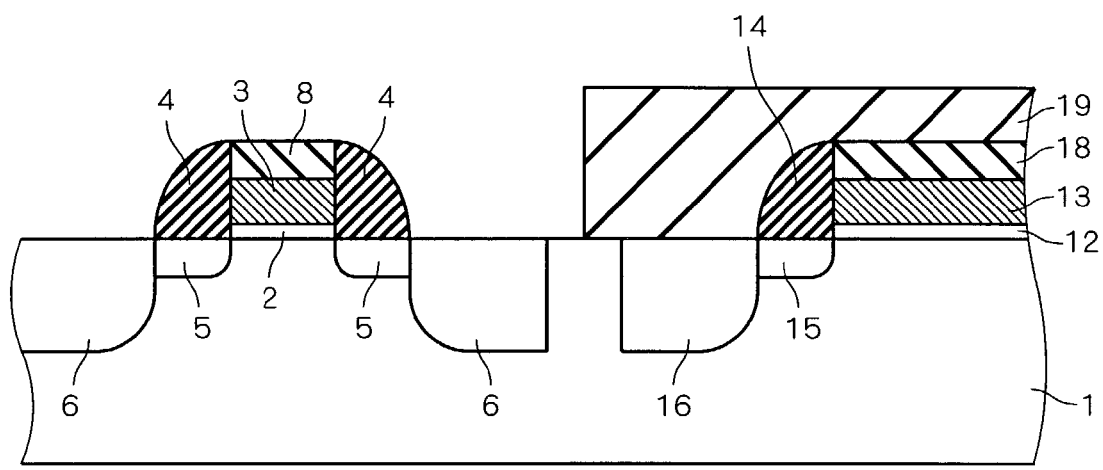
FIGS. 15 and 16 are views for explaining a process for manufacturing a semiconductor device according to a third embodiment.
Figure 16:
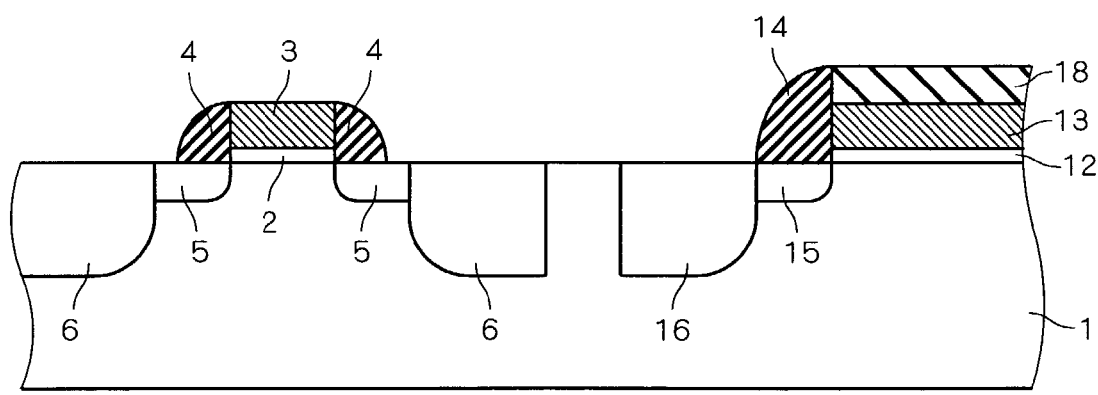

FIGS. 15 and 16 are views for explaining a process for manufacturing a semiconductor device according to the present embodiment. In these drawings, the same components as those in FIG. 11 have the same reference numerals. Moreover, a transistor constituted by a gate oxide film 12, a gate electrode 13, a side wall 14, a source-drain region 15 having a low concentration and a source-drain region 16 having a high concentration is shown on the right side of FIGS. 15 and 16. For convenience of the description, a transistor shown on the left side of FIGS. 15 and 16 requires the removal of the hard mask 8 and the transistor shown on the right side does not require the removal of the hard mask 8.

In the present embodiment, the ion implantation into the first channel region and the ion implantation into the second channel region are completed, and a resist to be used as a mask in that case is removed. Then, a resist 19 opening only a portion in which the hard mask 8 is to be removed is formed as shown in FIG. 15. Thereafter, etch back is carried out by using the resist 19 as a mask, thereby removing the hard mask 8. Subsequently, the resist 19 is also removed. Consequently, the semiconductor device shown in FIG. 1 is formed in only the portion in which the hard mask is to be removed (that is, the transistor on the left side in FIG. 16) as shown in FIG. 16. In other words, the hard mask 18 provided on an upper surface of the gate electrode 13 remains in the portion in which the removal of the hard mask 8 is not required (that is, the transistor on the right side in FIG. 16).

According to the present embodiment, therefore, the number of mask alignments is increased and the hard mask can be caused to remain in the portion in which the hard mask is not required. Then, it is possible to hold the advantage of the hard mask, that is, to protect a gate electrode at a subsequent step. In the portion in which the hard mask is removed, moreover, it is apparent that the same effects as those described in the first embodiment can be obtained.

While FIG. 16 shows the example in which the hard mask 8 is to be removed from the whole upper surface of the gate electrode 3 of the transistor in which the hard mask 8 is to be removed, the hard mask 8 may be removed from only a partial region of the upper surface of the gate electrode 3.

Since other manufacturing steps are the same as those described in the first embodiment, detailed description will be omitted.

<Fourth Embodiment>

In the third embodiment, the hard mask is removed from the portion provided on the gate electrode in which the hard mask is to be removed, and is caused to remain in the other portions. In an example according to a fourth embodiment, a hard mask is removed from only a portion provided on a gate electrode having an upper surface on which a contact is to be formed. FIGS. 17A and 17B are views for explaining a structure of a semiconductor device according to the present embodiment. In FIGS. 17A and 17B, components having the same functions as those in FIG. 1 have the same reference numerals. More specifically, in the present embodiment, the gate electrode on which the contact is not formed causes a hard mask 8 to remain on an upper surface of a gate electrode 3 as shown in FIG. 17A. On the other hand, the hard mask 8 is removed from the gate electrode on which the contact is formed. As shown in FIG. 17B, therefore, the hard mask is not present on the upper surface of the gate electrode 3.

In a method of manufacturing the semiconductor device according to the present embodiment, when forming the resist 19 opening only the portion in which the hard mask is to be removed in the third embodiment, it is preferable to form the opening on the gate electrode on which the contact is to be provided. Since other steps are the same as those in the third embodiment, detailed description will be omitted.

FIGS. 18A and 18B are views for explaining effects obtained by the present embodiment. Also in FIGS. 18A and 18B, components having the same functions as those in FIG. 1 have the same reference numerals. Moreover, the reference numeral 20 denotes a contact etching stopper layer and the reference numeral 21 denotes an interlayer insulating film. The reference numerals 22a and 22b denote a contact hole. The contact hole 22a serves to form a contact on a semiconductor substrate 1 and the contact hole 22b serves to form the contact on the gate electrode 3.

First of all, there will be supposed the case in which the hard mask 8 remains on the upper surface of the gate electrode 3 during the formation of the contact holes 22a and 22b. In that case, a structure shown in FIG. 18A is obtained after the contact holes 22a and 22b are formed. At this time, the contact hole 22a is formed by removing the interlayer insulating film 21 and the contact etching stopper layer 20 in a predetermined region. On the other hand, the hard mask 8 is to be removed in addition to the interlayer insulating film 21 and the contact etching stopper layer 20 in the formation of the contact hole 22b. More specifically, since an upper layer structure of the semiconductor substrate 1 in the region in which the contact is to be formed is different from that of the gate electrode 3, it is hard to simultaneously form the contact holes 22a and 22b at the same step. For example, overetching is to be unnecessarily carried out in order to remove the hard mask 8 with the formation of the contact hole 22b. Consequently, there is a possibility that reliability of an operation of the semiconductor device to be formed might be deteriorated.

Next, there will be supposed the case in which the hard mask 8 does not remain on the upper surface of the gate electrode 3 during the formation of the contact holes 22a and 22b. In that case, a structure shown in FIG. 18B is obtained after the contact holes 22a and 22b are formed. As is apparent from FIG. 18B, both of the contact holes 22a and 22b are formed by removing only the interlayer insulating film 21 and the contact etching stopper layer 20 in a predetermined region. More specifically, the upper layer structure of the semiconductor substrate 1 in the region in which the contact is to be formed is almost equal to that of the gate electrode 3. Therefore, it is easy to simultaneously form the contact holes 22a and 22b at the same step. Moreover, excessive overetching does not need to be carried out. Accordingly, a process for manufacturing the semiconductor device can be simplified and the reliability of the operation can be enhanced.

FIG. 18B shows the example in which the hard mask 8 is removed from the whole upper surface of the gate electrode of a transistor in which the contact is to be formed. The hard mask 8 may be removed from only a partial region including the portion of the upper surface of the gate electrode 3 in which the contact is to be formed.

Moreover, it is apparent that the same effects as those in the third embodiment can be obtained also in the fourth embodiment.

<Fifth Embodiment>

Each of the embodiments described above is particularly effective for a floating gate type nonvolatile memory including an NOR type flash memory. In a fifth embodiment, description will be given to an example in which the present invention is applied to the NOR type flash memory.

FIGS. 19A and 19B to FIGS. 23A and 23B are views for explaining a process for manufacturing a flash memory to be a semiconductor device according to the present embodiment. By using these drawings, the process for manufacturing the flash memory according to the present embodiment will be described below.

First of all, a floating gate electrode 32 in a cell array region is formed on a semiconductor substrate 31. Then, a control gate electrode 33 is formed on the floating gate electrode 32. Simultaneously with the step of forming the floating gate electrode 32, a gate electrode 34 of a transistor in a peripheral circuit region (hereinafter referred to as a "peripheral transistor") is also formed. At this time, both of the floating gate electrode 32 and the gate electrode 34 of the peripheral transistor are formed by patterning using a hard mask as a mask. In other words, the hard mask is formed on upper surfaces of the floating gate electrode 32 and the gate electrode 34 of the peripheral transistor at this time.

Figure 19A:
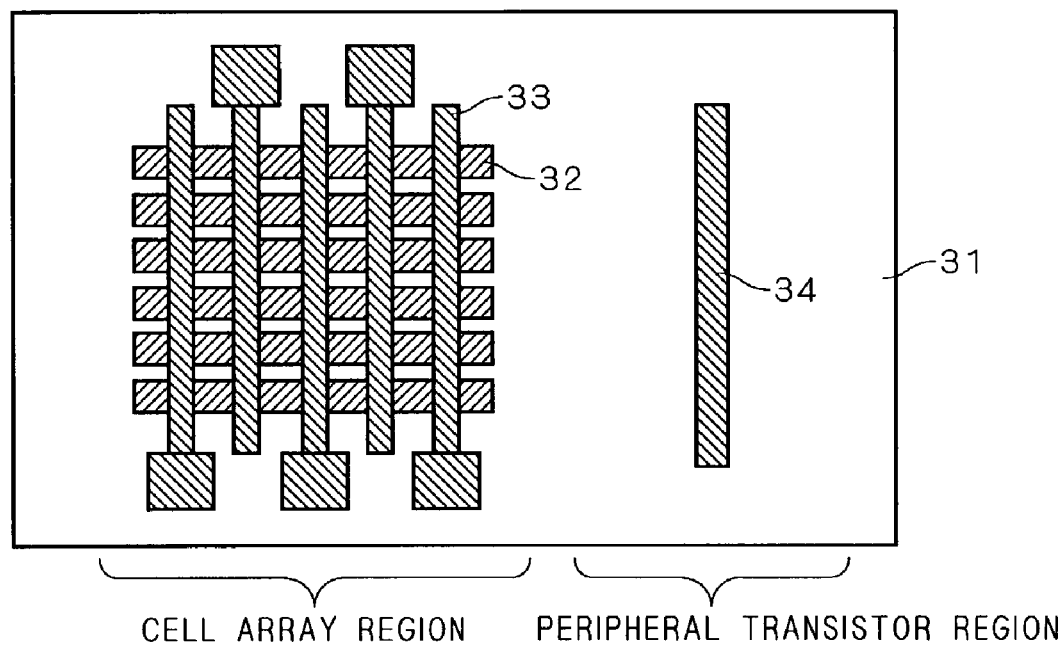
Figure 19B:
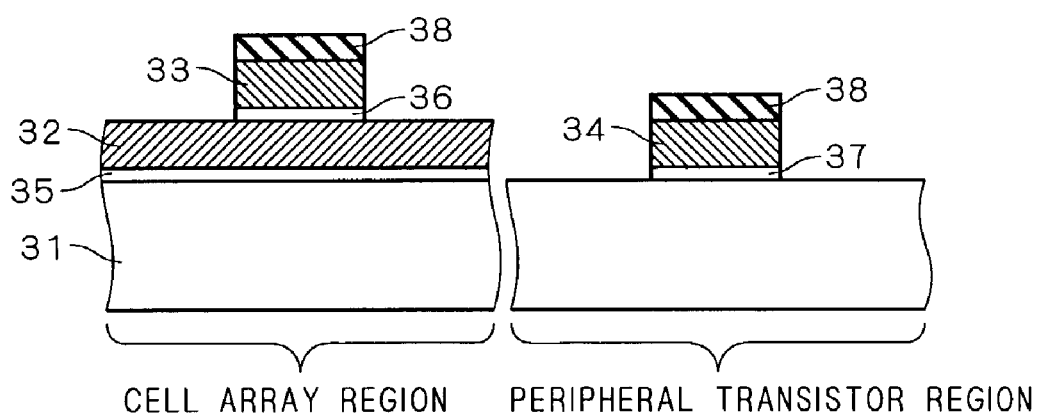

FIG. 19A is a top view showing this state and FIG. 19B is a sectional view showing each gate electrode in the cell array region and the peripheral circuit region. In FIG. 19B, the reference numeral 35 denotes a tunnel oxide film, the reference numeral 36 denotes an ONO (Oxide-Nitride-Oxide) film, the reference numeral 37 denotes a gate oxide film, and the reference numeral 38 denotes a hard mask.

Figure 20:
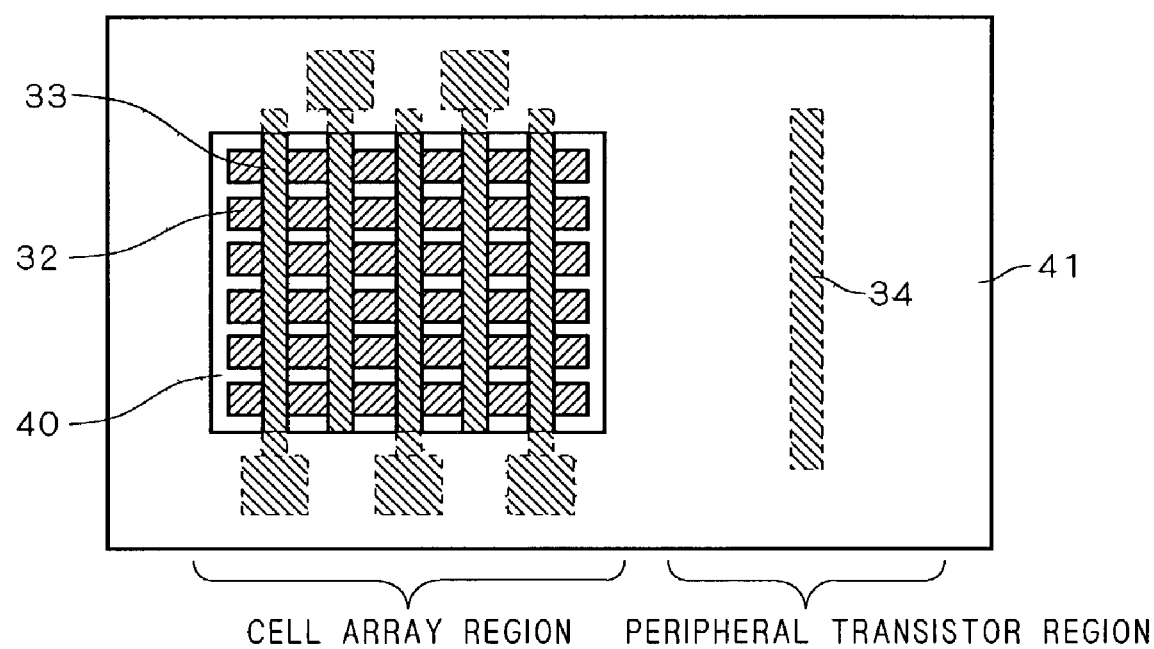

In this stage, adjacent cells are connected to each other by the floating gate electrode 32. Therefore, it is necessary to separate the floating gate electrode 32 into each cell unit. The separation of the floating gate electrode 32 is executed by carrying out etching using the control gate electrode 33 as a mask in a self alignment process. At the etching step, a resist 41 having an opening portion 40 is formed on a cell portion to be etched as shown in FIG. 20. At this time, a hard mask 38 is formed on an upper surface of the control gate electrode 33. As described above, therefore, the upper surface of the control gate electrode 33 can be prevented from being unnecessarily etched.

Figure 21A:
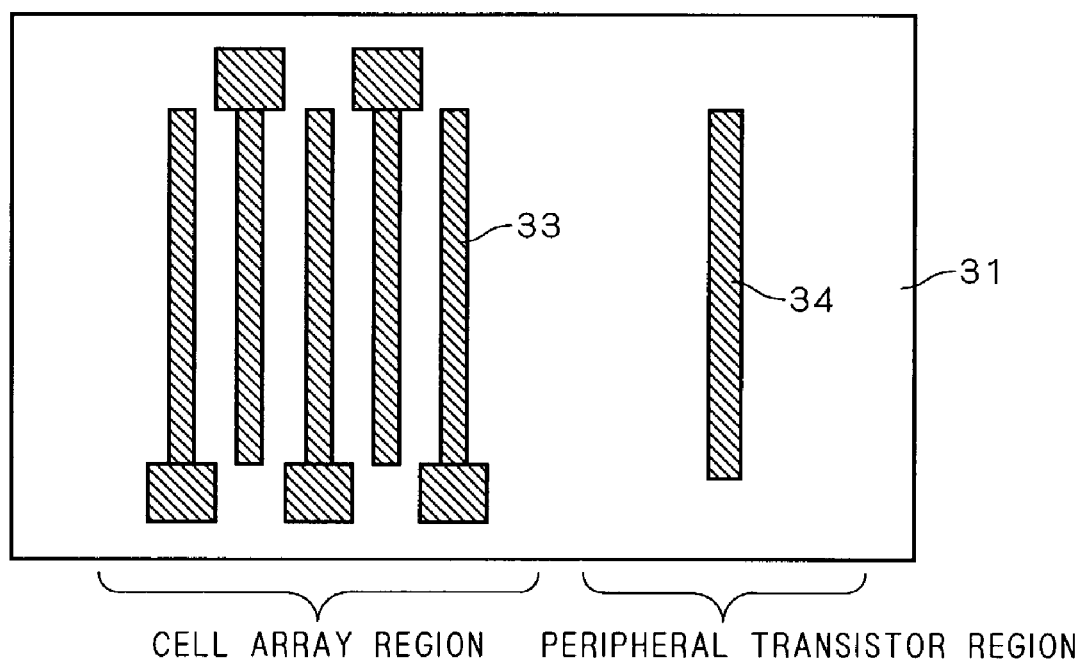
Figure 21B:
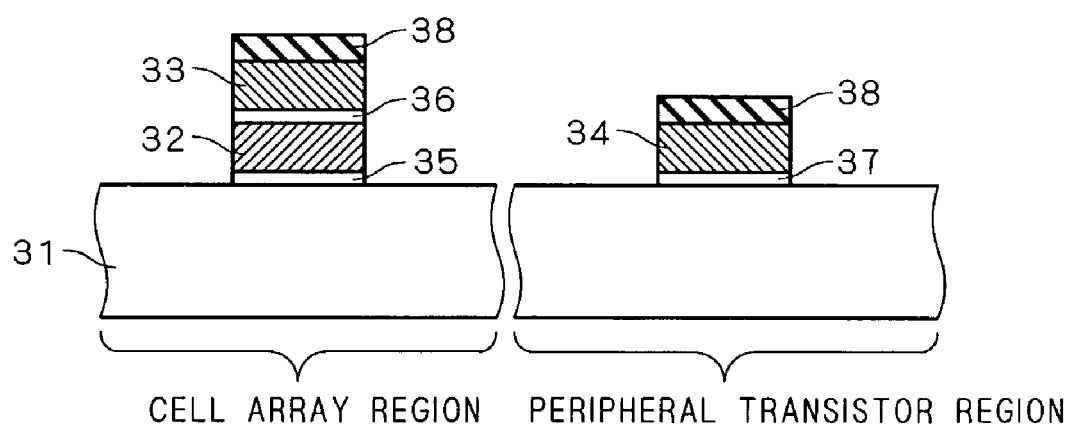

As shown in FIGS. 21A and 21B, consequently, the floating gate electrode 32 provided between the control gate electrodes 33 is removed and is isolated for each cell. FIG. 21A is a top view showing this state and FIG. 21B is a sectional view showing each gate electrode in the cell array region and the peripheral circuit region.

Figure 22:
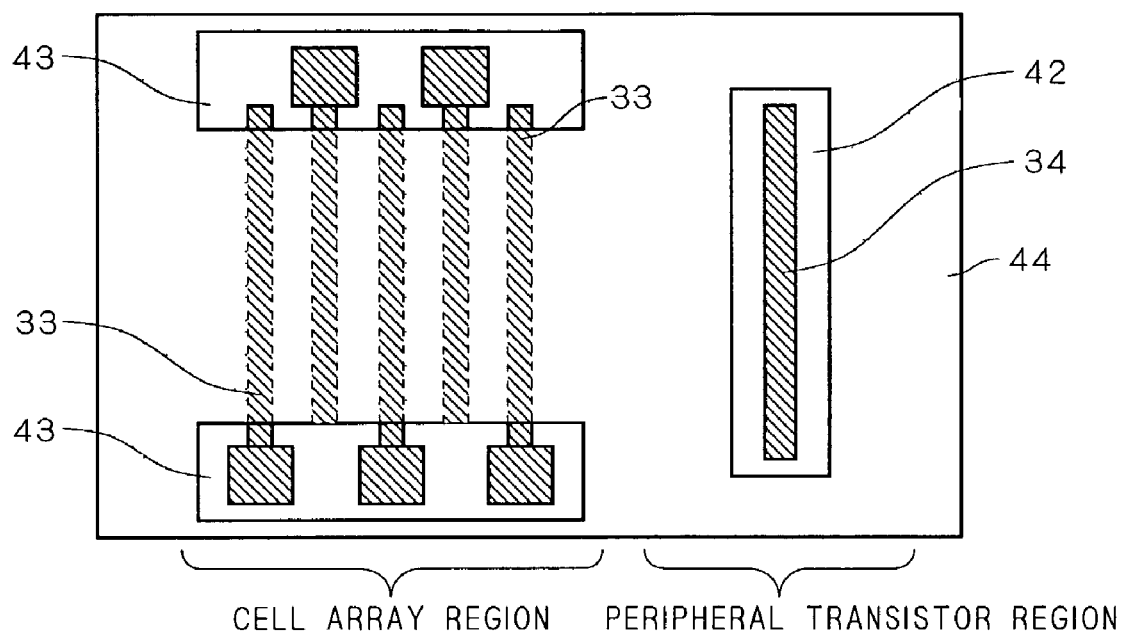

At the same step as that described in the first embodiment, ion implantation is carried out over a first channel region (a Pch region or an Nch region) in the peripheral circuit region. At this time, a resist opening the first channel region is formed. In the present embodiment, as shown in FIG. 22, a resist 44 having an opening portion 43 is also formed on a region of the cell array region in which a contact is to be formed in addition to the opening portion 42 formed on the first channel region in the peripheral circuit region.

Etching is carried out by using the resist 44 as a mask, and the hard mask 38 is removed from the gate electrode 34 of a peripheral transistor and the contact formation region in the control gate electrode 33 of the cell array region. At this time, a region of the control gate electrode 33 other than the contact formation region is covered with the resist 44. Consequently, the hard mask 38 remains. More specifically, the peripheral transistor has the structure shown in FIG. 1, and furthermore, the hard mask 38 in the contact formation region is removed from the upper surface of the control gate electrode 33 so that the hard mask 38 is present in only a portion other than the contact formation region. In other words, the processing according to the first embodiment is carried out for the peripheral circuit region and the processing according to the fourth embodiment is carried out for the cell array region at the same time.

Subsequently, a resist opening a second channel region reversely to the first channel region in the peripheral circuit is formed to carry out ion implantation, and the hard mask 38 is removed from the peripheral transistor in the second channel region by using the resist as a mask.

As described above, according to the present embodiment, the first and fourth embodiments can be simultaneously executed for the floating gate type flash memory. In other words, both of the effects in the first and fourth embodiments can be obtained. In other words, it is apparent that the present invention is particularly effective for the floating gate type flash memory. Since the effects of the first and fourth embodiments can be obtained as described above, detailed description will be omitted.

Moreover, a resist to be formed for the ion implantation into the first channel region in the peripheral circuit region can be utilized for a mask in the removal of the hard mask 38 provided on the contact formation region in the control gate electrode 33 in the cell array region. Therefore, the number of mask alignments is not increased as compared with a conventional step of manufacturing a flash memory. Accordingly, a process for manufacturing the semiconductor device can be simplified and integration can be enhanced.

Moreover, while the removal of the hard mask in the contact formation region of the cell array region is carried out simultaneously with that of the hard mask in the first channel region of the peripheral circuit region in the embodiment, it is not restricted thereto but may be performed simultaneously with the removal of the hard mask in the second channel region. More specifically, if the removal of the hard mask in the contact formation region is carried out simultaneously with that of the hard mask in the first or second channel region, the same effects can be obtained.

While the NOR type flash memory is taken as an example in the above description, the application of the present invention is not restricted thereto but it is apparent that the same effects can be obtained for all kinds of floating gate type flash memories.

As shown in FIG. 22, furthermore, the resist 44 is formed in an upper part of a cell array during the removal of the hard mask 38. In that portion, therefore, unnecessary etching is not carried out. Accordingly, the unnecessary etching can be prevented from being carried out for an isolating film formed in the cell array region so that a thickness of the isolating film can be maintained. Consequently, it is also possible to obtain such an advantage that a contact punch through margin is not deteriorated in the process for manufacturing the flash memory.

Figure 23A:
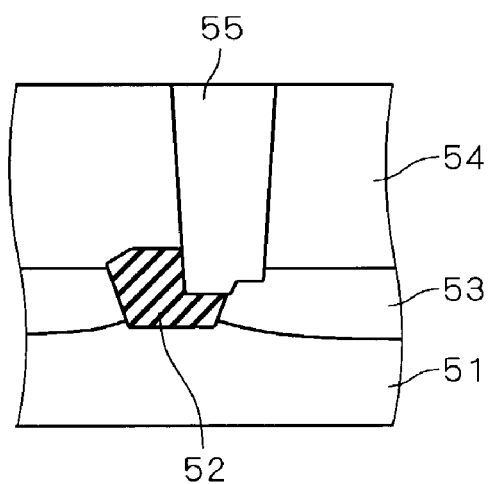
FIGS. 23A and 23B are views for explaining effects in the fifth embodiment.
Figure 23B:
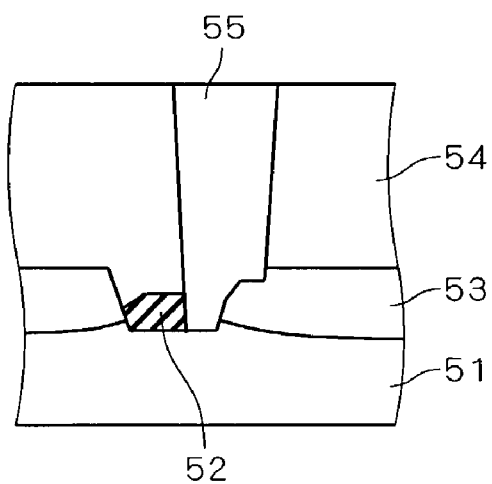
Figure 24A:
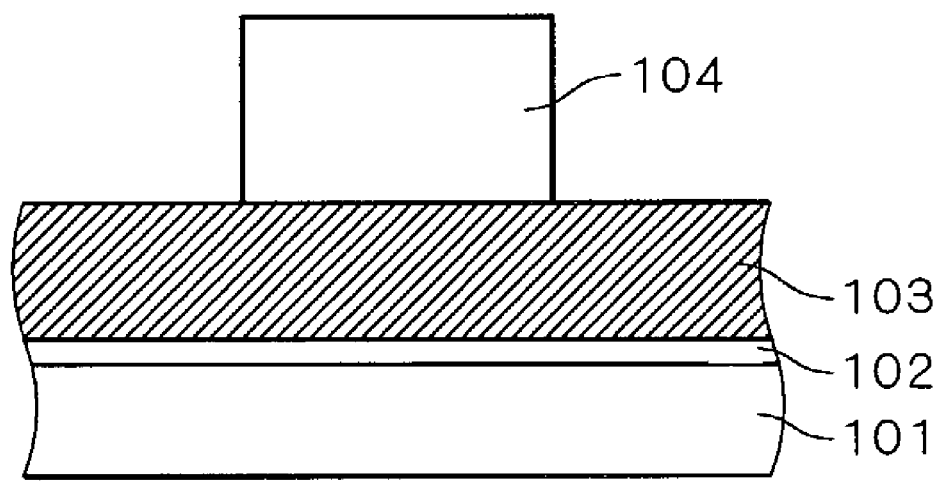
FIGS. 24A and 24B are views for explaining a step of forming a gate electrode of a conventional semiconductor device using a resist as a mask.
Figure 24B:
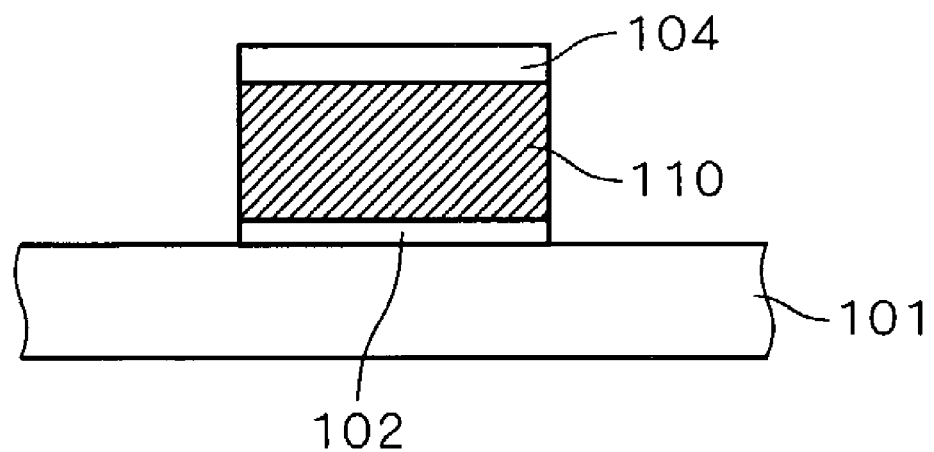
Figure 25A:
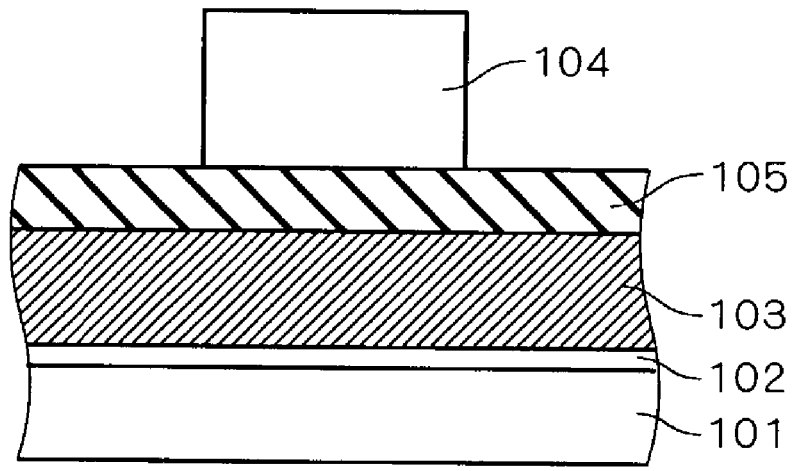
FIGS. 25A to 25C are views for explaining a step of forming a gate electrode of a conventional semiconductor device using a hard mask as a mask.
Figure 25B:
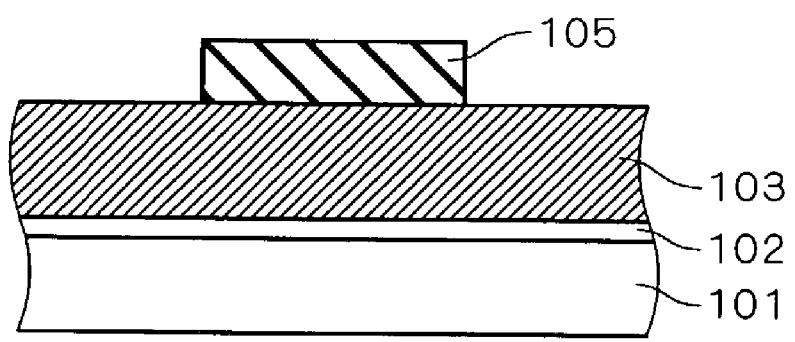
Figure 25C:
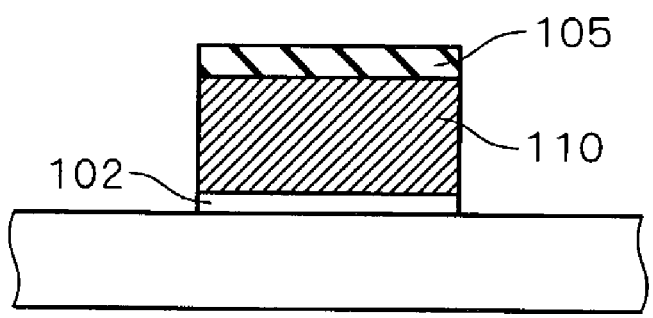
Figure 26A:
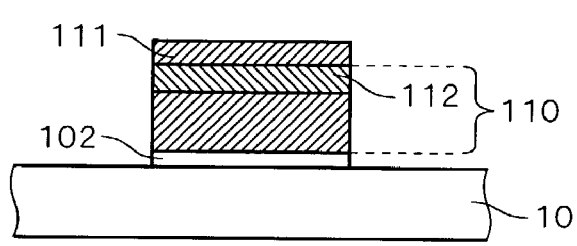
FIGS. 26A and 26B and FIGS. 27A and 27B are views for explaining problems of the conventional semiconductor device.
Figure 26B:
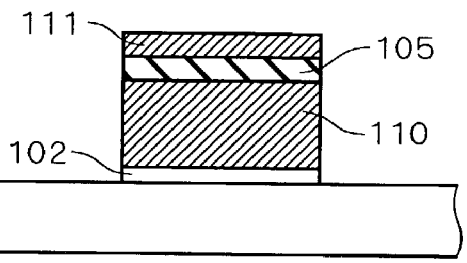
Figure 27A:
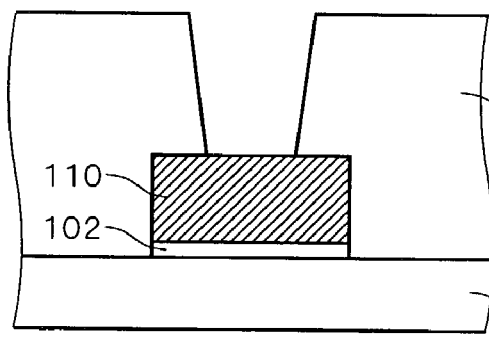
Figure 27B:
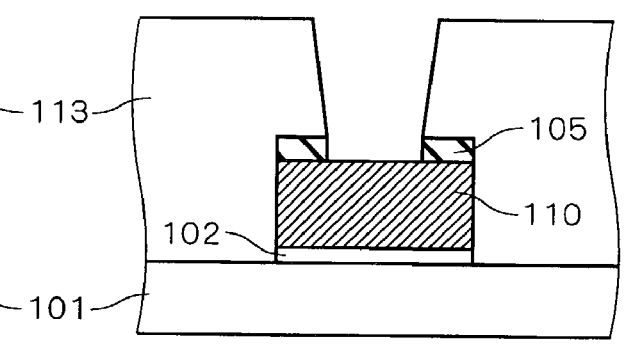

FIGS. 23A and 23B are views for explaining the contact punch through margin. In FIGS. 23A and 23B, the reference numeral 51 denotes a semiconductor substrate, the reference numeral 52 denotes an isolating film, the reference numeral 53 denotes a well, the reference numeral 54 denotes an interlayer insulating film, and the reference numeral 55 denotes a contact hole for coming in contact with the well 53.

FIG. 23A shows the case in which the isolating film 54 maintains a sufficient thickness. It is assumed that a shift is generated by a mask misalignment during formation of the contact hole 55 and the contact hole 55 slips over the isolating film 52 as shown in FIG. 23A. At this time, the isolating film 52 is overetched because an etching selectivity of each of the interlayer insulating film 54 and the isolating film 52 is not very high. In the example of FIG. 23A, however, the isolating film 52 maintains a sufficient thickness. Therefore, the overetched portion does not reach the semiconductor substrate 51.

On the other hand, FIG. 23B shows the case in which the isolating film 52 cannot have a sufficient thickness due to unnecessary etching or the like. Also in this case, it is assumed that a shift is generated in the formation of the contact hole 55 and the contact hole 55 slips over the isolating film 52 as shown in FIG. 23B. At this time, in the example of FIG. 23B, the overetched portion generated in the isolating film 52 reaches the semiconductor substrate 51 because the isolating film 52 does not have a sufficient thickness. Consequently, the contact hole 55 is short-circuited in a region of the semiconductor substrate 51 other than the well 53, resulting in a malfunction of the semiconductor device.

As described above, the cell array region is not unnecessarily etched during the removal of the hard mask 38 in the fifth embodiment. Therefore, the isolating film formed in the cell array region can be prevented from being unnecessarily etched so that the thickness of the isolating film can be maintained to be great. In the process for manufacturing the flash memory, therefore, a deterioration in the contact punch through margin can be prevented.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising, on a semiconductor substrate, a peripheral circuit having a transistor and a cell array having a plurality of memory cells,
    wherein said transistor of said peripheral circuit includes:
    a first gate electrode;
    a side wall formed on a side surface of said first gate electrode; and
    a source-drain region formed in said semiconductor substrate and having a low impurity concentration region provided so as to sandwich said gate electrode and a high impurity concentration region provided outside said low impurity concentration region so as to sandwich said gate electrode,
    wherein a width of said side wall is smaller than a space between said first gate electrode and said high impurity concentration region,
    a contact is formed on an upper surface of said source-drain region, and
    said memory cell of said cell array includes:
    a second gate electrode; and
    a hard mask formed on an upper surface of said second gate electrode, and
    said hard mask is formed in only a region of said upper surface of said second gate electrode other than a region in which a contact is to be formed.

2. A method of manufacturing a semiconductor device comprising the steps of:
    (a) etching a gate electrode material formed on a semiconductor substrate by using a hard mask as a mask, thereby forming at least one gate electrode having said hard mask on an upper surface;
    (b) forming a side wall on a side surface of said gate electrode having said hard mask on said upper surface;
    (c) carrying out first ion implantation by using, as a mask, said gate electrode having said hard mask on said upper surface and said side wall; and
    (d) removing said hard mask of predetermined said gate electrode by etching said hard mask and said sidewall simultaneously after said step (c),
    wherein a surface of said side wall is removed, and said side wall becomes approximately as high as said gate electrode in said step (d).

3. The method of manufacturing a semiconductor device according to claim 1, further comprising the step of:
    (e) forming a contact on said upper surface of said gate electrode from which said hard mask is removed.

4. The method of manufacturing a semiconductor device according to claim 2, further comprising the step of:

(f) saliciding said upper surface of said gate electrode from which said hard mask is removed.

5. A method of manufacturing a semiconductor device comprising the steps of:
   (a) etching a gate electrode material formed on a semiconductor substrate by using a hard mask as a mask, thereby forming at least one gate electrode having said hard mask on an upper surface;
   (b) forming a first resist opening a first channel region of said semiconductor substrate;
   (c) carrying out first ion implantation by using, as masks, said gate electrode having said hard mask on said upper surface and said first resist;
   (d) removing said hard mask by etching said hard mask and said side wall simultaneously using said first resist as a mask after said step (c);
   (e) removing said first resist;
   (f) forming a second resist opening a second channel region of said semiconductor substrate;
   (g) carrying out second ion implantation by using, as masks, said gate electrode having said hard mask on said upper surface and said second resist;
   (h) removing said hard mask by etching said hard mask and said side wall simultaneously using said second resist as a mask after said step (g); and
   (i) removing said second resist,
   wherein a surface of said side wall is removed, and said side wall becomes approximately as high as said gate electrode in said steps (d) and (h).

6. The method of manufacturing a semiconductor device according to claim 5, further comprising the step of:
   (j) forming a contact on said upper surface of said gate electrode from which said hard mask is removed.

7. The method of manufacturing a semiconductor device according to claim 5, further comprising the step of:
   (k) saliciding said upper surface of said gate electrode from which said hard mask is removed.

8. A method of manufacturing a semiconductor device comprising the steps of:
   (a) etching a gate electrode material formed on a semiconductor substrate by using a hard mask as a mask, thereby forming at least one gate electrode having said hard mask on an upper surface;
   (b) forming a first resist opening a first channel region of said semiconductor substrate;
   (c) carrying out first ion implantation by using, as masks, said gate electrode having said hard mask on said upper surface and said first resist;
   (d) removing said first resist;
   (e) forming a second resist opening a second channel region of said semiconductor substrate;
   (f) carrying out second ion implantation by using, as masks, said gate electrode having said hard mask on said upper surface and said second resist;
   (g) removing said second resist; and
   (h) removing said hard mask by etching said hard mask and said side wall simultaneously after said steps (a) to (g),
   wherein a surface of said side wall is removed, and said side wall becomes approximately as high as said gate electrode in said step (h).

9. The method of manufacturing a semiconductor device according to claim 8, further comprising the step of:
   (i) forming a third resist opening a predetermined region before said step (h),
   said etching in said step (h) being carried out by using said third resist as a mask.

10. The method of manufacturing a semiconductor device according to claim 8, further comprising the step of:
    (j) forming a contact on said upper surface of said gate electrode from which said hard mask is removed.

11. The method of manufacturing a semiconductor device according to claim 8, further comprising the step of:
    (k) saliciding said upper surface of said gate electrode from which said hard mask is removed.

12. A method of manufacturing a semiconductor device comprising a peripheral circuit having a transistor and a cell array having a memory cell, comprising the steps of:
    (a) etching a gate electrode material formed on a semiconductor substrate by using a hard mask as a mask, thereby forming a first gate electrode of said transistor and a second gate electrode of said memory cell which have said hard mask on upper surfaces;
    (b) forming a resist opening a predetermined channel region in said peripheral circuit and a contact formation region in said cell array;
    (c) carrying out ion implantation by using, as masks, said first gate electrode and said second gate electrode which have said hard mask on said upper surfaces, and said resist; and
    (d) removing said hard mask by etching said hard mask and said side wall simultaneously using said resist as a mask after said step (c),
    wherein a surface of said side wall is removed, and said side wall becomes approximately as high as said gate electrode in said step (d).

* * * * *